United States Patent [19]
Koizumi et al.

[11] Patent Number: 5,503,708
[45] Date of Patent: Apr. 2, 1996

[54] METHOD OF AND APPARATUS FOR REMOVING AN ORGANIC FILM

[75] Inventors: Kootaroo Koizumi, Kodaira; Sukeyoshi Tsunekawa, Tokorozawa; Kenichi Kawasumi, Oume; Takeshi Kimura, Higashimurayama; Keisuke Funatsu, Hamura, all of Japan

[73] Assignee: Hitachi, Ltd., Tokyo, Japan

[21] Appl. No.: 155,858

[22] Filed: Nov. 23, 1993

[30] Foreign Application Priority Data

Nov. 27, 1992 [JP] Japan ................................ 4-318076

[51] Int. Cl.⁶ .................................................. H01L 21/00
[52] U.S. Cl. ..................... 156/643.1; 156/646.1; 134/1.3; 216/58; 216/66
[58] Field of Search ............... 156/646.1, 643.1, 156/345; 216/66, 58; 134/1.3

[56] References Cited

U.S. PATENT DOCUMENTS

| | | | |
|---|---|---|---|
| 5,234,540 | 8/1993 | Grant et al. | 156/646 |
| 5,298,112 | 3/1994 | Hayasaka et al. | 156/643 |

FOREIGN PATENT DOCUMENTS

| | | |
|---|---|---|
| 1-179327 | 7/1989 | Japan . |
| 4-302145 | 10/1992 | Japan . |

Primary Examiner—Thi Dang
Attorney, Agent, or Firm—Fay, Sharpe, Beall, Fagan, Minnich & McKee

[57] ABSTRACT

An organic film removing method uses an organic film removing apparatus comprising a processing vessel defining a processing chamber, a wafer support for supporting a semiconductor wafer within the processing chamber, and a mixed gas supplier for supplying a mixed gas consisting of an alcohol or alcohols, and ozone gas or an ozone-containing gas into the processing chamber so that the mixed gas acts on an organic film pattern on the surface of the supported semiconductor wafer. The apparatus continuously supplies the mixed gas into the processing chamber at least in a period between a time immediately before mounting the semiconductor wafer on the wafer support and a time when the organic film is removed completely; conveys the semiconductor wafer into the processing chamber; supports the semiconductor wafer within the processing chamber; and heats the patterned organic film on the surface of the supported semiconductor wafer at a temperature in a range below a temperature at which substantial defects will be formed in the elements of a semiconductor device to be formed on the semiconductor wafer. This method is capable of ashing the organic film at an ashing rate equal to or higher than an ashing rate at which a known organic film removing method employing a steam-containing ozone gas ashes the organic film, and of reducing water marks as compared with the known method employing the steam-containing ozone gas.

10 Claims, 4 Drawing Sheets

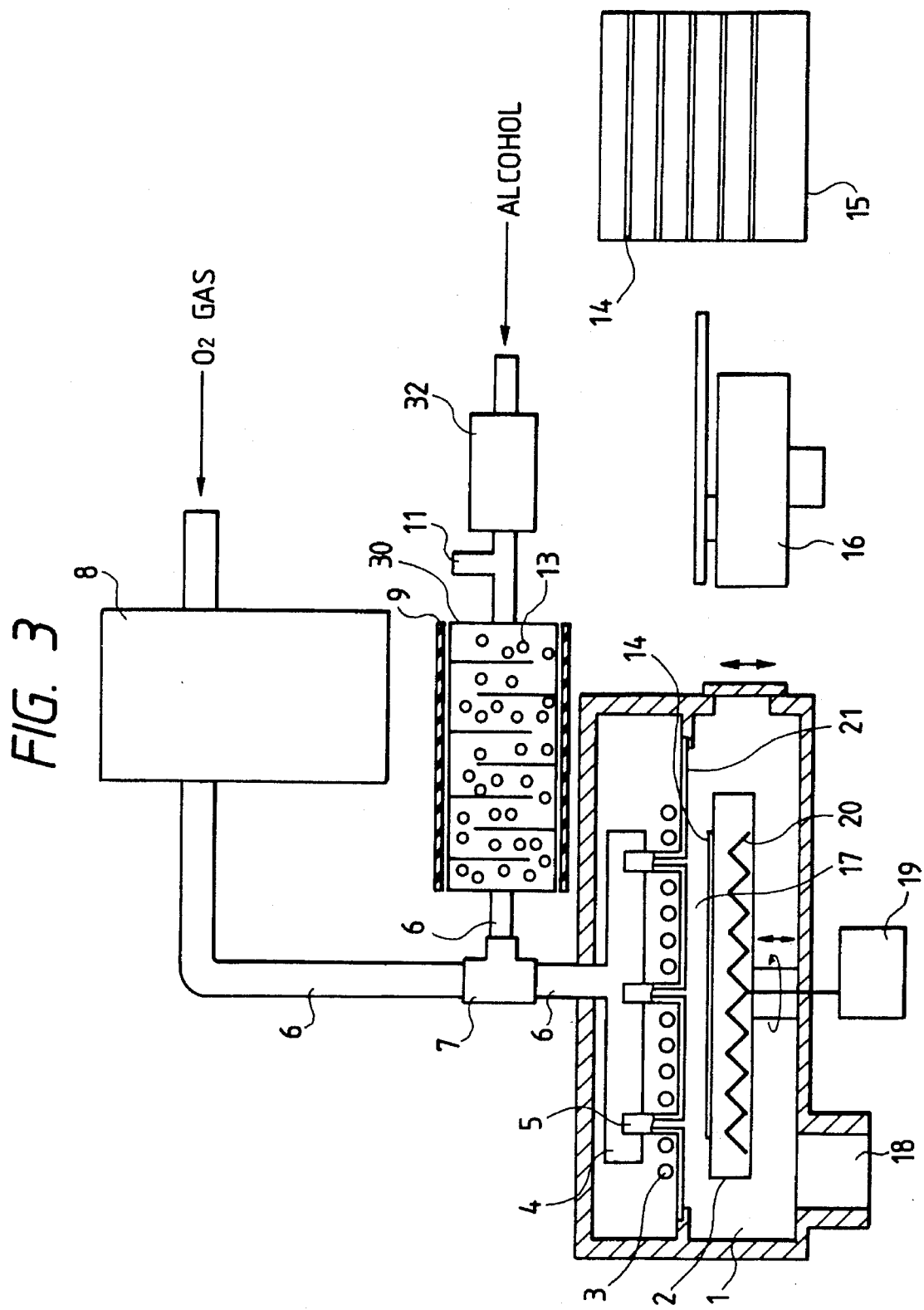

METHOD OF AND APPARATUS FOR REMOVING AN ORGANIC FILM

BACKGROUND OF THE INVENTION AND SUMMARY OF THE INVENTION

The present invention relates to a method of removing a photoresist film formed in a pattern on the surface of a semiconductor wafer and an apparatus for carrying out the method.

A photoresist (hereinafter referred to simply as a "resist") is an organic substance. A known organic film removing method called "ozone ashing" exposes a photoresist film (hereinafter referred to simply as a "resist film") to a hot gas containing ozone to remove the resist film by thermal decomposition. Another known organic film removing method removes a resist film by destroying the chemical bonds between the atoms of the resist forming the resist film with ultraviolet radiation, converting ozone into excited oxygen atoms, and applying the excited oxygen atoms after destroying the chemical bonds to the resist film to convert the resist forming the resist film into a volatile substance by decomposing the resist by oxidation. The foregoing known ozone ashing method is called an ultraviolet ozone ashing method or a photoashing method. Both the former ashing method and the latter ashing method have an advantage in that the element-forming region of a semiconductor wafer (hereinafter, referred to simply as a "wafer") exposed to an ashing atmosphere is scarcely damaged by charged particles during ashing because the ashing atmosphere contains few charged particles.

The temperature of the resist film must be increased to enhance the ashing rate because, at a high temperature, the heated resist promotes the chemical reaction between the resist, and ozone, and/or ultraviolet radiation. One method of increasing the temperature of the resist film heats the wafer on a wafer stage with an electric heater built in the wafer stage. Another method of increasing the temperature of the resist film irradiates the resist film with heating lamps. Since the resist film is formed integrally with the wafer, both the resist film and the wafer are heated simultaneously when increasing the temperature of the resist film by either of the foregoing methods.

If the wafer is exposed to heat of a high temperature during the ashing process, flaws are formed in the element-forming region of the wafer doped with impurities. When the wafer is subjected to a high-temperature ashing process, undesirable thermal diffusion of the impurities occurs in the element-forming region of the wafer, which entails defects in and malfunction of the elements of the semiconductor device, such as defects attributable to the dimensional change of the diffused layers of the semiconductor elements. Therefore, the temperature of the resist film during the ashing process (hereinafter, referred to as the "processing temperature") must be lower than a critical temperature above which substantial defects are formed in the elements. This critical temperature decreases with the increase of the degree of integration of the semiconductor device, because the higher the degree of integration, the greater is the possibility that the undesirable thermal diffusion of impurities causes defects in the elements. Although an upper limit processing temperature for the conventional methods has been, for example, in the range of about 250° C. to about 300° C., there is a tendency to lower the upper limit processing temperature to a temperature on the order of 200° C. and further to a temperature on the order of 150° C.

However, the decrease of the processing temperature entails significant reduction of ashing rate, because the rate of chemical reaction between the resist, ozone and/or ultraviolet radiation is retarded when the processing temperature is lowered. The reduction of the ashing rate reduces the throughput of the semiconductor device fabricating process and deteriorates the mass-productivity of the semiconductor device.

An ashing method intended to suppress the ashing rate reducing effect of the reduction of the processing temperature is disclosed in Japanese Patent Laid-open No. 4-302145. This previously proposed ashing method uses an ozone-water mixed gas prepared by mixing ozone gas and steam. It is stated in the reference that the ashing rate in an ashing process using the ozone-water mixed gas is about 1.2 times the ashing rate in an ashing process using ozone gas, provided that other ashing conditions are fixed. It is inferred that the use of the ozone-water mixed gas enhances the ashing rate because ozones decompose upon the absorption of ultraviolet light mostly of 254 nm in wavelength into radical oxygen atoms having high energy, and steam enhances the quantum efficiency in producing radical oxygen atoms.

However, the inventors of the present invention found that foreign matter remains on the surface of the wafer when the wafer is processed by this known ashing method. This problem will be described hereinafter with reference to FIG. 1.

Referring to FIG. 1, which shows a known ashing apparatus of a single wafer processing type that uses an ozone-water mixed gas prepared by mixing ozone gas and steam, a resist film of a desired pattern for use as a mask is formed over the surface of each of a plurality of wafers 14 separately stored on a wafer holder 15. The wafers 14 are fed one at a time into a processing chamber 1 defined by a processing vessel by a wafer conveying mechanism 16. The wafer 14 fed into the processing chamber 1 is mounted on a wafer stage 2 capable of supporting a single wafer at a time. The wafer stage 2 is provided internally with an electric heater 20. A temperature controller 19 regulates the electric power supplied to the electric heater 20 so that the surface of the wafer stage 2 is maintained at a desired temperature.

Although it is desirable to heat the wafer stage 2 at a comparatively high temperature to increase the ashing rate when ashing the resist film, it is also desirable that the temperature of the wafer stage 2 be comparatively low to prevent damaging the elements formed on the wafer 14. Generally, the wafer stage 2 is heated at an appropriate temperature in the range of 150° C. to 250° C. Since the heat capacity of the wafer stage 2 is far greater than that of the wafer 14, the wafer 14 can be heated at a temperature infinitely close to the surface temperature of the wafer stage 2. However, the temperature of the wafer 14, immediately after the wafer 14 of a temperature nearly equal to the room temperature has been mounted on the wafer stage 2, is different from the surface temperature of the wafer stage 2, and it takes some time for the temperature of the wafer 14 to rise substantially to the surface temperature of the wafer stage 2. The greater the maximum output of the electric heater 20, the shorter the time necessary for heating the wafer 14 mounted on the wafer stage 2 to a temperature equal to the surface temperature of the wafer stage 2.

A partition plate 21 formed of high-purity quartz divides the interior of the processing vessel into the processing chamber 1 and a light source chamber containing an ultraviolet light source 3. The partition plate 21 is fixedly provided with a plurality of nozzles 5 connected to a distribution tube 4. The ultraviolet light source 3 is disposed near the partition plate 21. The ultraviolet light source 3 is used to enhance the ashing rate; however, the same is not necessarily essential to ashing. A mixed gas prepared by mixing ozone gas and steam is supplied through a supply line 6 into the distribution tube 4. The ozone gas is produced by converting oxygen gas using an ozonizer 8. Oxygen gas containing about 5% ozone is supplied at a rate on the order of 10 l/min. The ozonizer 8 produces ozone gas at a fixed rate and supplies the ozone gas to the supply line 6.

An ozone-containing gas may be used instead of pure ozone gas. A water metering device 12 supplies water at a fixed rate to a steam generating device 10, and then the steam generator generates steam at a fixed rate. The steam generated by the steam generating device 10 is supplied into the supply line 6. The ozone gas and the steam are mixed at a pipe fitting 7 to produce the mixed gas. Then, the mixed gas flows through the supply line 6, the distribution tube 4 and the nozzles 5 into the processing chamber 1. Subsequently, the mixed gas flows along the surface of the wafer 14 and is discharged from the processing chamber 1 through a discharge opening 18.

It is preferable to mix ozone gas and steam at a fixed ozone/steam ratio when producing the mixed gas. If either ozone gas or steam is not metered, the steam content of the mixed gas will be excessively large or excessively small. If the steam content of the mixed gas is excessively small, the mixed gas is not sufficiently effective in increasing the ashing rate. If the steam content is excessively large, condensation of the stem contained in the mixed gas, for example, on the inner surface of the supply line 6 is liable to occur before the mixed gas reaches the surface of the wafer 14.

The mixed gas must be supplied continuously during the operation of the ashing apparatus to supply a mixed gas having a fixed steam content into the processing chamber 1. If the ozonizer 8 is not in a constant operating state or the steam generating device 10 does not generate steam at a predetermined rate, the steam content of the mixed gas will be excessively large or excessively small. Accordingly, the mixed gas must be supplied into the processing chamber 1 at least in a period between a point of time immediately before placing the wafer in the processing chamber 1 and a point of time when the resist film is removed completely.

The ashing apparatus shown in FIG. 1 and an ashing apparatus shown in FIG. 3 are suitable for single-wafer processing. When processing wafers for ashing in a single-wafer processing mode, given a repeating cycle including steps of placing a wafer in the processing chamber, removing the resist film by ashing, and taking out the wafer from the processing chamber, it is desirable to supply the processing gas continuously into the processing chamber to process wafers at a high throughput. It is preferable that the temperature of the mixed gas be high enough to prevent the condensation of steam contained in the mixed gas, for example, on the inner surface of the supply line 6 before the mixed gas reaches the surface of the wafer 14.

When a wafer having a surface temperature substantially equal to the room temperature is transferred from the outside to the inside of the processing chamber 1, the steam contained in the mixed gas condenses into water drops on the resist film pattern and the exposed portions of the surface of the wafer, because part of the moisture contained in the mixed gas containing steam and prevailing in the vicinity of the surface of the wafer is cooled locally, just like a pair of glasses become fogged when the person wearing the pair of glasses enters a heated room from the cold outside. The humidity of the processing chamber 1 is comparatively high because the mixed gas containing steam is supplied into the processing chamber 1, and the temperature of the processing chamber 1 is comparatively high because the wafer stage 2 is heated. Accordingly, it is considered that, in most cases, the condensation of steam on the surface of the wafer is unavoidable regardless of the temperature of the wafer placed in the processing chamber 1 because the ashing apparatus having the processing chamber 1 is used in a clean room.

The condensation of steam contained in the mixed gas must be discriminated from dewing. Even if dewing does not occur within the line for supplying the mixed gas, it is highly probable that condensation of steam will occur on the surface of the wafer. Generally, the condensation of steam on the surface of the wafer is more likely to occur than dewing in the mixed gas supply line, and the condensation has a more significant effect on the wafer processing than the dewing in the mixed gas supply line.

For example, the dewing can be obviated by reducing the length of the steam supply line connecting the steam generating device 10 to the processing chamber and/or heating the pipe forming the steam supply line with a heater, whereas it is difficult to prevent the condensation of steam on the surface of the wafer. It may be effective to heat the wafer beforehand in a dry atmosphere before placing the wafer in the processing chamber 1, which, however, requires an additional apparatus connected to the ashing apparatus, increases the cost of the ashing apparatus, and increases the processing steps to affect adversely the through put of the ashing apparatus.

Water drops formed on the surface of the wafer by condensation evaporate and form water marks on the surface of the wafer. Generally, water marks are whitish, translucent marks. It is considered that water marks are a layer of an oxide, such as $SiO_2$, produced by interaction between water ($H_2O$) and a substance, such as Si, forming the surface of the wafer. Water marks cannot be removed by ashing because the oxide forming the water marks is an inorganic substance.

After the completion of the ashing process, the wafer is subjected to necessary semiconductor device fabricating processes including a thin film forming process in other semiconductor processing apparatuses. If water marks remain on the surface of the wafer, part of a thin film and an aluminum wiring film is formed on the water mark during such semiconductor device fabricating processes. Since the elements of a semiconductor device are formed in a minute region, water marks having a certain thickness and size are foreign matter which cause defects in the elements of the semiconductor device.

FIGS. 2(a) and 2(b) show a thin film formed on the surface of a wafer (semiconductor substrate) having a water mark. FIG. 2(a) shows a defect in the thin film caused by the water mark and FIG. 2(b) shows a wafer (semiconductor substrate) having a water mark, and a thin film formed on the wafer having the water mark and covering the water mark. There is the possibility that both the thin films shown in FIGS. 2(a) and 2(b) are unable to function properly and cause defects in the elements.

A method intended to suppress the reduction of the ashing rate attributable to the decrease of the processing temperature is proposed in Japanese Patent Laid-open No. 1-179237.

This method uses a mixed gas consisting of ozone gas, oxygen, steam and hydrogen peroxide ($H_2O_2$). The ashing rate of this method proposed in reference 2 is several times that of a method which uses ozone gas alone, provided that other conditions for ashing including the processing temperature are the same.

However, as is generally known, hydrogen peroxide is highly toxic to human bodies and hence this method entails many problems in securing the safety of operators for the ashing process. Further, since hydrogen peroxide discharges oxygen atoms, changes into water by deoxidization, and has a boiling point of 151.4° C. which is higher than that of water, the mixed gas containing hydrogen peroxide is far more liable to form water marks than the mixing gas containing steam. Therefore, it is not practically desirable to use the mixed gas containing hydrogen peroxide for ozone ashing.

Accordingly, it is a first object of the present invention to provide an organic film removing method capable of removing a resist film formed in a pattern on the surface of a wafer by ashing using ozone gas or an ozone-containing gas at an ashing rate substantially equal to or higher than that at which the resist film can be removed by ashing using a steam-containing ozone gas or an ozone-containing gas under the same ashing conditions including processing temperature, and of reducing water marks more effectively than the method using a steam-containing ozone gas.

A second object of the present invention is to provide an organic film removing apparatus for carrying out the organic film removing method for achieving the first object.

To achieve the first object, the present invention provides an organic film removing method, which uses an organic film removing apparatus provided with a processing vessel defining a processing chamber in which to remove a resist film formed on the surface of a semiconductor wafer, a wafer support means disposed within the processing chamber for supporting the semiconductor wafer, and a processing gas supply means for supplying a mixed gas produced by adding an alcohol to an ozone-containing gas or ozone gas to the surface of the semiconductor wafer supported on the wafer supporting means, comprising the following steps:

supplying the mixed gas into the processing chamber for at least a period between a point of time before placing the semiconductor wafer on the wafer support means within the processing chamber and a point of time when the resist film is removed completely;

supporting the semiconductor wafer on the wafer support means within the processing chamber; and heating the resist film formed on the surface of the semiconductor wafer supported on the wafer support means within the processing chamber at a temperature in a range below a temperature which will cause defects in the elements of a semiconductor device to be formed on the semiconductor wafer.

Generally, the ashing rate of an ashing method which uses a mixed gas produced by adding an alcohol to ozone gas or an ozone containing gas (hereinafter referred to inclusively as "ozone gas") is equal to or higher than the ashing rate of an ashing method which uses a mixed gas consisting of steam and ozone gas. It is inferred that the ashing rate of the former ashing method is equal to or higher than that of the latter ashing method because the effect of the alcohol on the enhancement of the quantum efficiency in producing radical oxygen atoms is higher than that of steam.

Although the alcohol, as well as water, condenses at a temperature below its boiling point, generally, alcohol drops rarely form marks corresponding to the water marks on the surface of a wafer because the alcohol rarely forms an inorganic substance together with the substance, such as Si, forming the surface of the wafer. The moisture content of the mixed gas produced by adding the alcohol to ozone gas is far smaller than that of the mixed gas produced by adding steam to ozone gas and, consequently, the use of the former mixed gas is very effective in eliminating causes of water marks.

It is desirable to use an alcohol having a comparatively low boiling point because an alcohol having a comparatively low boiling point does not easily condense on the surface of the wafer and, hence, causes of development of foreign substances on the surface of the wafer can be reduced. It is preferable to use an alcohol having a boiling point that is at least lower than that of water (100° C.). The use of a mixed gas containing an alcohol reduces the probability of forming foreign substances more effectively than the use of a mixed gas containing steam because the probability of formation of foreign substances when a mixed gas containing an alcohol is used is lower than that when a mixed gas containing steam is used.

Preferable alcohols are methanol, ethanol and propanol. These alcohols have boiling points lower than that of water. For example, the boiling point of ethanol is 64.5° C. The mixed gas may be produced by mixing at least one of methanol, ethanol and propanol; only one of methanol, ethanol and propanol; or alcohols other than methanol, ethanol, and propanol; with ozone gas or the like. The mixed gas may additionally contain steam in a small content because the use of an alcohol or alcohols in combination with steam suppresses the formation of water marks.

The organic film removing method of the present invention is suitable particularly for removing resist films formed on wafers in a single wafer processing mode. When the organic film removing method is carried out in a single wafer processing mode, it is desirable to supply the mixed gas continuously into the processing chamber during the operation of the organic film removing apparatus because the surface treatment of the wafer is a continuous process.

A preferable quantity of a liquid alcohol or liquid alcohols at a room temperature to one liter of ozone at a room temperature under atmospheric pressure is in the range of 0.2 g to 4 g. If the quantity of liquid alcohol or liquid alcohols is less than 0.2 g, it is impossible to carry out the ashing process at an ashing rate substantially equal to or higher than that at which the ashing process is carried out by using a steam-containing mixed gas. The quantity of liquid alcohol or liquid alcohols greater than 4 g is excessively large; the surplus liquid alcohol or liquid alcohols do not contribute to ashing. Although the greater the quantity of liquid alcohol or liquid alcohols, the higher the ashing rate, the ashing rate reaches a maximum when the quantity of liquid alcohol or liquid alcohols is increased to 4 g. Therefore, 4 g is a substantial maximum quantity effective in increasing the ashing rate.

It is desirable to irradiate the surface of the wafer with ultraviolet radiation during the ashing process. The use of ultraviolet radiation having a wavelength of 185 nm and ultraviolet radiation having a wavelength of 254 nm are particularly effective for increasing the ashing rate.

Desirably, the mixed gas is produced by mixing ozone gas and an alcohol vapor produced by heating a liquid alcohol or liquid alcohols, because the latent heat of the alcohol vapor suppresses the condensation and dewing of the alcohol or alcohols.

Ozone gas and an alcohol or alcohols may be mixed either inside the processing chamber or outside the processing chamber, so long as the mixed gas is blown against the surface of the wafer.

The mixed gas may also contain an inert gas, such as nitrogen, argon, or helium, as a carrier gas for carrying alcohol vapor.

The processing chamber need not be separated from the atmosphere, i.e., the processing chamber may be open to the atmosphere, because the ashing process need not be carried out in a vacuum atmosphere. Accordingly, the processing vessel defining the processing chamber need not be airtight. An ashing apparatus having such a processing vessel has a simple construction, which may be known.

A desirable processing temperature is in the range of 150° C. to 250° C.

An organic film removing apparatus of the present invention to achieve the second object comprises:

a processing vessel defining a processing chamber in which to remove a resist film formed in a pattern on a semiconductor wafer;

a wafer supporting means for supporting the semiconductor wafer within the processing chamber, disposed within the processing chamber;

a mixed gas supply means for supplying a mixed gas produced by mixing ozone gas and an alcohol or alcohols into the processing chamber so as to be blown against a resist film formed in a pattern on the surface of the wafer supported on the wafer supporting means; and a heating means for heating the resist film formed on the surface of the wafer supported on the wafer supporting means.

BRIEF DESCRIPTION OF THE DRAWINGS

FIG. 3 is a schematic sectional view of an organic film removing apparatus in a preferred embodiment according to the present invention.

DESCRIPTION OF THE PREFERRED EMBODIMENTS

Figure 1:
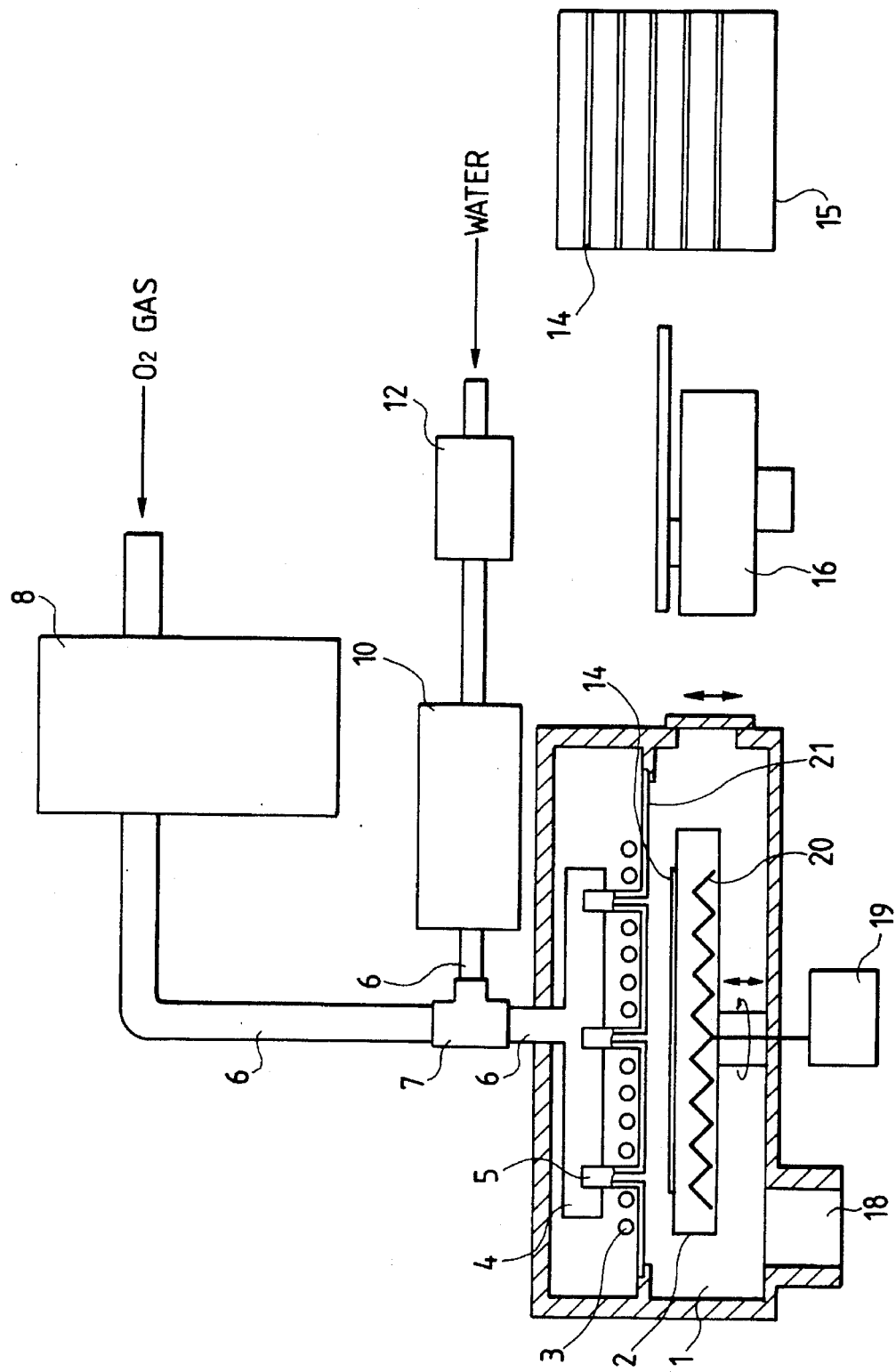
FIG. 1 is a schematic sectional view of a known organic film removing apparatus which uses steam-containing ozone gas.
Figure 2A:
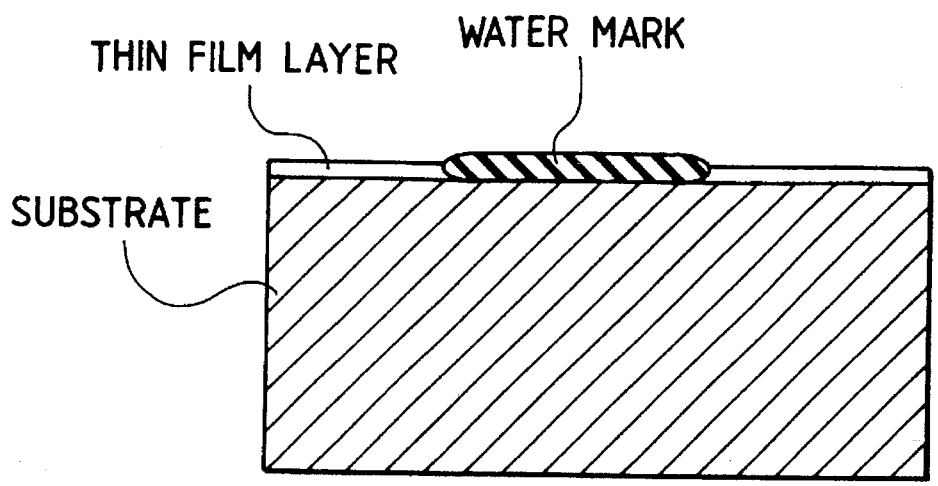
FIGS. 2(a) and 2(b) are sectional views of wafers provided with thin films formed over the surfaces thereof having water marks, respectively.
Figure 2B:
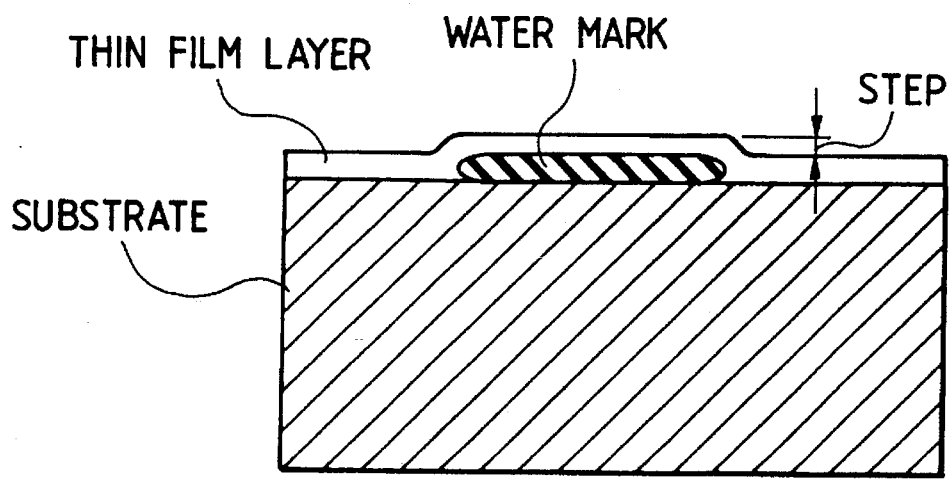

FIG. 3 shows an organic film removing apparatus in a preferred embodiment according to the present invention, which is substantially the same in construction as the known organic film removing apparatus shown in FIG. 1, except that the former is provided with an alcohol metering device 32 and an alcohol vapor generating device 30 instead of the water metering device 12 and the steam generating device 10.

The organic film removing apparatus embodying the present invention will be described hereinafter with reference to FIG. 3, in which parts like or corresponding to those previously described with reference to FIG. 1 are denoted by the same reference characters, and the description thereof will be omitted to avoid duplication.

Wafers 14 are conveyed one at a time by a wafer-conveying mechanism 16 into a processing chamber 1, where the wafer 14 is mounted on a wafer stage 2. The wafer stage 2 is vertically movable. When mounting the wafer 14 on the wafer stage 2, the wafer stage 2 is lowered to facilitate mounting the wafer 14 thereon, and then the wafer stage 2 is raised after the wafer 14 has been mounted thereon. The wafer stage 2 is held at a height during the ashing process so that the height of the space 17 between the surface of the wafer 14 and a partition plate 21 is, for example, about 0.2 mm. It is preferable that the height of the space 17 be as small as possible to make a mixing gas containing active ozone gas having a comparatively short lifetime act effectively on a resist film formed on the surface of the wafer 14. The smaller the height of the space, the higher the ashing rate.

The wafer stage 2 is provided internally with an electric heater 20. A temperature controller 19 controls the current supplied to the electric heater 20 so that the temperature of the wafer stage 2 is maintained at an appropriate temperature in the range of 150° C. to 250° C. Since the heat capacity of the wafer stage 2 is far greater than that of the wafer 14, the wafer 14 can be heated at a temperature infinitely close to that of the surface of the wafer stage 2.

A light source 3 is turned on when necessary to enhance the ashing rate. Preferably, the light source 3 comprises ultraviolet lamps, such as mercury lamps. A mixed gas consisting of ozone gas and an alcohol is supplied through a supply line 6 to a distribution tube 4. The ozone gas is produced by converting oxygen gas using an ozonizer 8. Oxygen gas is supplied to the ozonizer 8 at about 10 l/min. The ozone content of the oxygen gas is about 5%. The ozonizer 8 produces ozone gas at a constant rate and sends the ozone gas to the supply line 6. An alcohol metering device 32 supplies a liquid alcohol at a constant rate to an alcohol vapor producing device 30, and the alcohol vapor producing device 30 produces alcohol vapor at a constant rate and sends the alcohol vapor to a supply line 6. The ozone gas and the alcohol vapor are mixed within a pipe fitting 7 to produce a mixed gas. The mixed gas flows through a supply line 6 and the distribution tube 4, and is directed toward the surface of the wafer 14 by nozzles 5. The mixed gas is discharged outside the processing chamber 1 through a discharge duct 18.

Preferably, the ozone gas and the alcohol vapor are both supplied at respective fixed rates to the pipe fitting. If the alcohol content of the mixed gas is excessively small, a substantial effect of the mixed gas on the enhancement of the ashing rate cannot be expected. If the alcohol content of the mixed gas is excessively large, the dewing of moisture contained in the mixed gas is liable to occur within the mixed gas supply line including the supply line 6.

The mixed gas must be supplied continuously during the operation of the organic film removing apparatus to maintain the alcohol content of the mixed gas substantially constant. If the ozonizer 8 does not operate in a steady state or the alcohol vapor generating device 30 does not generate alcohol vapor at a necessary rate, the alcohol content of the mixed gas will become excessively large or excessively small. Therefore, the mixed gas must be continuously supplied at least in a period between a point of time immediately before feeding the wafer 14 into the processing chamber and a point of time when the resist film, i.e., the organic film, is removed completely.

The organic film removing apparatus shown in FIG. 3 is suitable for operation in a single wafer processing mode. It is preferable to supply the mixed gas continuously, particularly when the organic film removing apparatus operates in a single-wafer processing mode. Preferably, the mixed gas is heated at a comparatively high temperature that will prevent the dewing of the mixed gas within the supply line 6.

The alcohol vapor generating device 30 is formed of high-purity quartz and is packed with high-purity quartz particles 13 to prevent the bumping of the alcohol. When necessary, nitrogen gas which serves as a carrier gas for carrying the alcohol vapor is supplied through a carrier gas inlet port 11 into the alcohol vapor generating device 30. The alcohol vapor generating device 30 is surrounded by a heater 9 for heating the liquid alcohol to convert the liquid alcohol into alcohol vapor.

As mentioned above, it is preferable to use methanol, ethanol, or propanol as an alcohol material for the mixed gas.

Figure 4:
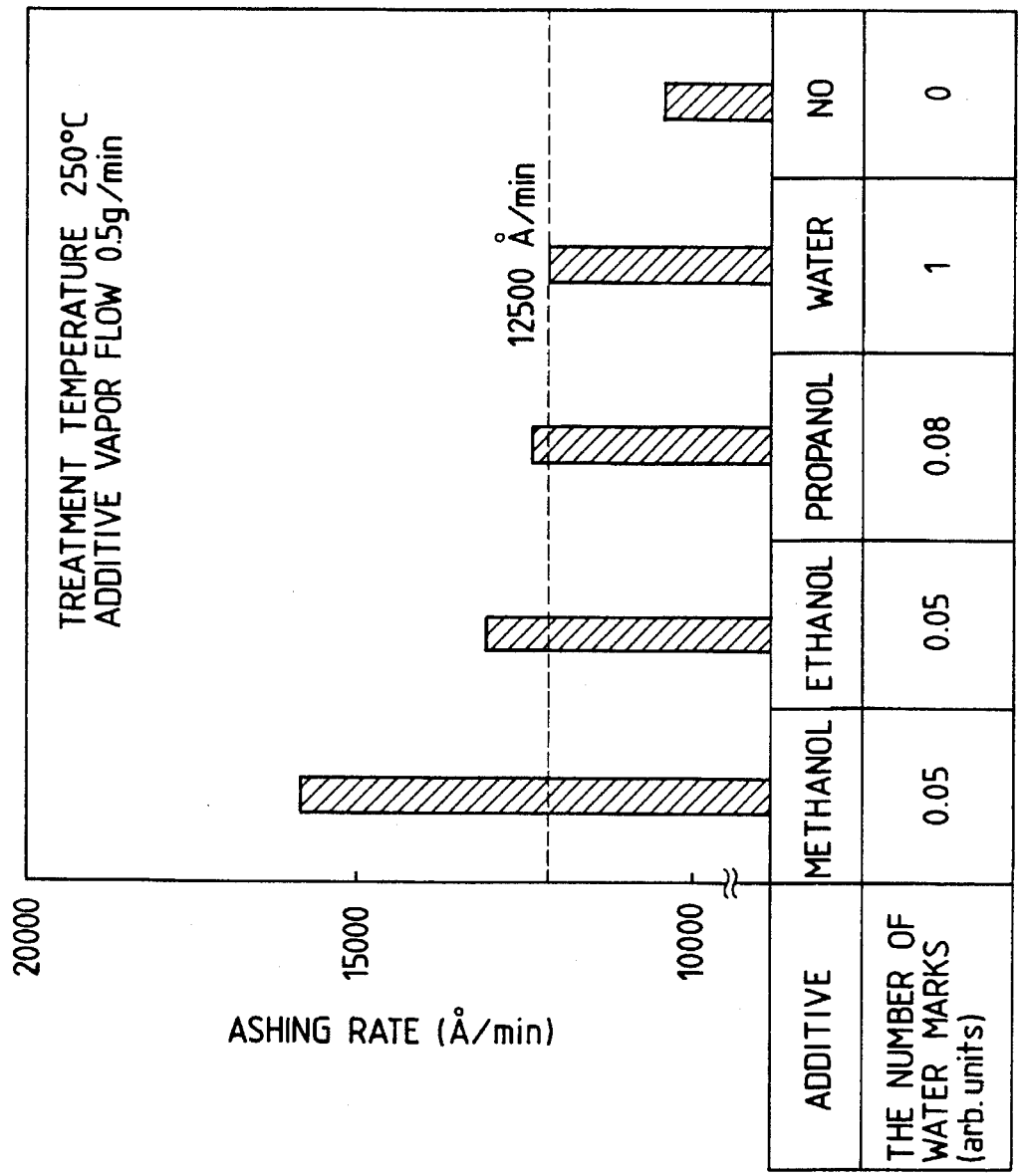
FIG. 4 is a graph comparatively showing the results of ashing processes carried out by organic film removing methods in accordance with the present invention and by a known organic film removing method.

FIG. 4 shows the results of experimental operation of the organic film removing apparatus shown in FIG. 3 and a known organic film removing apparatus which uses a mixed gas containing steam. The graph compares the two apparatuses in terms of ashing rate and the number of water marks formed on the surfaces of wafers. In the experiments, the processing temperature was 250° C. and the alcohol vapor or steam was supplied at a flow rate of 0.5 g/min.

As is obvious from FIG. 4, the ashing rate is 12,500 Å/min when the steam-containing ozone gas is used, and the ashing rates for a mixed gas containing methanol, a mixed gas containing ethanol, and a mixed gas containing propanol are higher than 12,500 Å/min. In the experiments, the mixed gases respectively containing only methanol, only ethanol, and only propanol were used to determine the effect of methanol, ethanol, and propanol clearly. Results obtained when ozone gas containing neither an alcohol nor steam (indicated by "NO" in FIG. 4) are shown for comparison. The ashing rate when only ozone gas is used is far lower than those when the mixed gases are used.

Only water marks having maximum dimensions not smaller than 0.3 μm were counted because water marks having maximum dimensions less than 0.3 μm are practically ignorable. Values representing the numbers of water marks in FIG. 4 are those obtained by normalizing the number of water marks formed when each of the mixed gases was used by the number of water marks formed when the mixed gas containing steam was used. As is obvious from FIG. 4, the number of water marks formed when the mixed gases respectively containing methanol, ethanol, and propanol were used is far smaller in each case than that of water marks formed when the mixed gas containing steam was used. The number of water marks formed when ozone gas was used was negligibly small, which is inferred to be due to the negligibly small water content of ozone gas.

Although not shown in FIG. 4, it was found through the experimental operation that the use of the mixed gases respectively containing methanol, ethanol, and propanol reduces the number and quantity of the residue of the resist films greatly. The use of the mixed gas containing steam brought about a similar effect. On the other hand, the use of the ozone gas for ashing was unable to remove the resist film completely. Much residue of the resist film was found on the wafer after the completion of ashing.

The organic film removing method according to the present invention, which uses the foregoing mixed gas for removing an organic film pattern, i.e., a patterned resist film, by ashing, is capable of ashing the organic film at an ashing rate equal to or higher than the ashing rate at which the known organic film removing method, which uses ozone gas containing steam, removes the organic film, and of reducing water marks as compared with the known organic film removing method.

What is claimed is:

1. An organic film removing method for removing an organic film formed in a pattern on the surface of a semiconductor wafer that is supported by a wafer support in a processing chamber, comprising the steps of:

conveying the semiconductor wafer from outside the processing chamber into the processing chamber;

placing the semiconductor wafer on the wafer support;

continuously supplying a mixed gas including an alcohol and one of ozone gas and an ozone-containing gas into the processing chamber at least in a period between a point of time immediately before the semiconductor wafer is placed on the wafer support and a point of time when removal of the organic film is determined to be completed, so that the mixed gas will act on the organic film formed on the surface of the semiconductor wafer supported by the wafer support; and heating the organic film formed on the surface of the semiconductor wafer on the wafer support within the processing chamber at a temperature in a range below that at which substantial defects will be formed in the elements of a semiconductor device to be formed on the semiconductor wafer.

2. An organic film removing method according to claim 1, wherein the alcohol contained in the mixed gas has a boiling point below the boiling point of water.

3. An organic film removing method according to claim 1, wherein the alcohol contained in the mixed gas is at least one selected from the group consisting of methanol, ethanol, and propanol.

4. An organic film removing method according to claim 1, wherein the organic film removing method processes a single wafer at a time.

5. An organic film removing method according to claim 1, wherein the quantity of the alcohol at room temperature added to one liter of the ozone gas or ozone-containing gas at room temperature and atmospheric pressure is in the range of 0.2 g to 4 g.

6. An organic film removing method according to claim 1, wherein the organic film formed on the surface of the semiconductor wafer is irradiated with ultraviolet radiation while the mixed gas is blown against the organic film formed on the surface of the semiconductor wafer.

7. An organic film removing method according to claim 1, wherein the alcohol in the mixed gas is a vapor c onverted from a liquid by heating, and the alcohol vapor and said one of ozone gas and an ozone-containing gas are mixed to produce the mixed gas.

8. An organic film removing method according to claim 1, further comprising the steps, before said continuously supplying step, of:

supplying an inert gas as a carrier gas for carrying the alcohol;

mixing the inert gas with the alcohol; and mixing the inert gas and alcohol with said one of ozone gas and an ozone-containing gas to produce said mixed gas.

9. An organic film removing method according to claim 1, wherein the wafer support is a wafer stage, and the wafer stage is heated so that the temperature of the surface of the wafer stage is in the range of 150° C. to 250° C.

10. An organic film removing method according to claim 7, wherein the alcohol vapor is mixed with an inert gas as a carrier gas for carrying the alcohol vapor in said mixed gas.

* * * * *